United States Patent [19]
Chu et al.

[11] Patent Number: 5,168,348
[45] Date of Patent: Dec. 1, 1992

[54] IMPINGMENT COOLED COMPLIANT HEAT SINK

[75] Inventors: Richard C. Chu; Michael J. Ellsworth, Jr., both of Poughkeepsie; David T. Vader, New Paltz, all of N.Y.

[73] Assignee: International Business Machines Corporation, Armonk, N.Y.

[21] Appl. No.: 729,655

[22] Filed: Jul. 15, 1991

[51] Int. Cl.⁵ .............................................. H01L 23/02
[52] U.S. Cl. ........................................ 257/713; 257/714
[58] Field of Search ........................ 357/81, 82, 75, 79

[56] References Cited

U.S. PATENT DOCUMENTS

| | | | |
|---|---|---|---|
| 4,109,707 | 8/1978 | Wilson et al. | 165/46 |
| 4,203,129 | 5/1980 | Oktay et al. | 357/82 |
| 4,381,032 | 4/1983 | Cutchay | 165/46 |
| 4,964,458 | 10/1990 | Flint et al. | 160/80.4 |
| 5,006,924 | 4/1991 | Frankeny et al. | 357/82 |
| 5,049,982 | 9/1991 | Lee et al. | 357/82 |

OTHER PUBLICATIONS

IBM Technical Disclosure Bulletin, vol. 32, No. 9A, Feb. 1990, pp. 106-107, "Multi-Orifice Fluorocarbon III Devices".

IBM Technical Disclosure Bulletin, vol. 21, No. 1, Jun. 1978, p. 185-"Thermally Enhanced III Structure".

Primary Examiner—Edward J. Wojciechowicz
Attorney, Agent, or Firm—Richard M. Ludwin

[57] ABSTRACT

An impingement cooled compliant heat sink (CHS) is employed to extract heat from an array of computer chips in an electric module. A variety of embodiments and variations are provided. The most basic implementation is a metal sheet that is brought into contact with chips on a multi-chip module, and acts as a spreader plate for jet impingement immersion cooling with fluorocarbon, liquid nitrogen, or other dielectric liquids. This can increase cooling at a given flow rate by increasing the area for heat transfer. Slots and/or holes in teh sheet located between the chip sites serve to: (1) create flexible joints in the sheet between the chips to permit conformity to neighboring chip sites, (2) allow for clearance of decoupling capacitors and other structures on the substrate between the chips, and (3) permit the dielectric coolant to flow through the plate so that there will be no pressure difference across the CHS. The absence of pressure difference across the CHS is designed to render this cooling scheme relatively insensitive to pressure variations in the module.

22 Claims, 9 Drawing Sheets

802

902

1002

1102

1202

1302

IMPINGMENT COOLED COMPLIANT HEAT SINK

BACKGROUND OF THE INVENTION a. FIELD OF THE INVENTION

This invention relates to heat transfer mechanisms and more particularly to heat transfer mechanisms for removing heat generated in electronic circuit modules.

b. RELATED ART

The use of very large scale integration (VLSI) technology in chip design has necessitated the development of special cooling techniques to accommodate the high heat fluxes generated by modern integrated circuit chips. One of the more attractive methods for removing heat from these chips is through the use of an immersion cooling system. In this system, the integrated circuits are immersed directly in a conventional dielectric cooling liquid. The liquid boils at the surface of the chips, and/or flows over the chips by natural or forced convection, thereby cooling the integrated circuits. The heat is then removed from the liquid through a remote heat exchanger.

A conventional manner of exchanging the performance of immersion cooling systems is the application of extended surface heat sinks. An example of an immersion cooling type electronic module using extended surfaces is disclosed in U.S. Pat. No. 4,203,129 to Oktay et al. and assigned to the same assignee as the present invention.

In the above-referenced module, semiconductor chips are mounted on a substrate by means of metal contacts or solder balls (also known as C4s). An extended surface heat sink, which is made of a thermally conducting material, and contains tunnels that run through the heat sink and lie parallel to the chip, is bonded on the back of each semiconductor chip. The module and tunnels are oriented vertically so that the tunnels act as chimneys to promote heat dissipation by natural convection and/or nucleate boillng. In addition, spring loaded heat-conducting pistons contact the back of the heat sink and provide conventional conduction cooling of the semiconductor chips. The pistons are seated in the module housing, and are cooled by an attached cold plate, which has a cooling fluid circulating therethrough. The module housing is filled with a dielectric fluid up to a level that does not quite fill the housing. The dielectric fluid cools the tunneled heat sink directly, and acts to improve heat transfer between the semiconductor chips and the pistons.

While the application of extended surfaces to enhance immersion cooling of microelectronic circuits can be advantageous, limitations of these surfaces are (1) the need to make compact cooling structures that will permit continued reductions in the chip-to-chip spacing in multi-chip arrays, and (2) the need to limit the height of cooling structures, especially in a 3 dimensional package where increasing the height of cooling hardware will increase the vertical module-to-module spacing. Consequently, there are limits on both the lateral and vertical dimensions of extended surfaces, and the associated added cooling area. In addition, the design and installation of a heat sink must be such that the benefit of added cooling surface area exceeds the resistance to heat flow into and through the heat sink.

Another effective method of removing heat from VLSI type integrated circuit chips is by direct jet impingement cooling. An apparatus employing direct jet impingement cooling is described in an IBM Technical Disclosure Bulletin article entitled "MULTI-ORIFICE FLUOROCARBON IMPINGEMENT COOLING FOR ARRAYS OF MICROELECTRONIC DEVICES" (TDB Vol. 32, No. 9A, February 1990, pp. 106-107). In direct jet impingement systems, a jet of liquid dielectric coolant is directed against the surface of the chip. Because there is no heat sink protruding beyond the edges or above the chip, advantages of direct jet impingement cooling are a compact module and no chip pitch limitations. However, if there were an accidental loss of coolant flowing into the module, chips that are not contacted by a solid heat sink can quickly heat to damaging temperatures. Also, although high heat fluxes can be attained by direct impingement cooling, the required coolant flow rate may be prohibitive. Cooling by jet impingement takes place primarily in a thin layer of fluid adjacent to the chip (the thermal boundary layer). High impingement cooling rates generally require a high velocity flow, in which case a great deal of fluid can bypass each chip without aiding in thermal dissipation. Bulk mixing of the fluid and increased area for heat transfer can be achieved with an extended surface, permitting similar cooling performance at lower flow rates, or improved performance at the same flow rate.

U.S. Pat. No. 4,964,458 to Flint et al. and assigned to the same assignee as the present invention, discloses the use of a flexible, finned sheet as a heat sink in a conduction cooled electronic module. The use of such a flexible sheet provides an advantage in that such a heat sink can efficiently utilize the available space in the module both laterally (in that the dimensions of the sheet are commensurate with the lateral dimensions of the module) and vertically (by the provision of suitable fins at the cooled side of the heat sink).

While the apparatus of Flint at al. provides for enhanced air/liquid conduction cooling, the above-referenced patent does not address the issue of applying the flexible sheet technology to an immersion or liquid jet impingement cooling environment. Furthermore, this sheet acts as a barrier between the chip-substrate structure and the coolant. As the sheet is made thin to insure compliance to chip height variations and chip tilt, the danger of corrosion or mechanical stress related failure of the barrier increases. (Compliance to chip topology is desirable to achieve a low resistance to heat flowing across the chip-to-sheet interface.) Water is superior as a coolant to known dielectric fluids, and the use of water may compensate for a high chip-to-sheet resistance to heat flow. Water, however, is electrically conductive and would cause catastrophic damage to the circuits if the barrier were to fail. Because water is a solvent and corrosive, it may actually precipitate failure of the barrier. In addition, the pressure on the chip and/or coolant side of the sheet must be regulated against sudden surges or reductions in the flow since, if the chip-side pressure ever exceeds the coolant pressure, the sheet could separate from the chips, causing a catastrophic loss of cooling.

In light of the above, there is a need for a heat sink, compact in both height and perimeter, that is suitable for use in an immersion and jet impingement cooled electronic modules.

SUMMARY OF THE INVENTION

It is an object of this invention to enhance the cooling capabilities of electronic modules which use immersion and/or liquid jet impingement cooling systems.

This invention uses an impingement cooled compliant heat sink (CHS) to extract heat from an array of computer chips on a multi-chip module. A variety of embodiments and variations are provided.

The most basic implementation is a metal sheet that is brought into contact with chips on a multi-chip module, and acts as a spreader plate for jet impingement and immersion cooling with fluorocarbon, liquid nitrogen, or other dielectric liquids. This can increase convection and/or boiling heat transfer at a given flow rate by increasing the area for heat transfer. Slots and/or holes in the sheet located between the chip sites serve to: (1) create flexible joints in the sheet between chips to permit conformity to neighboring chip sites, (2) allow for clearance of decoupling capacitors and other structures on the substrate between the chips, and (3) permit the dielectric coolant to flow through the plate so that there will be no pressure difference across the CHS. The absence of pressure difference across the CHS will insure continuous CHS-to-chip contact, thereby rendering the cooling scheme relatively insensitive to pressure variations in the module.

Convective cooling can be enhanced by adding pin-fins, or other extended surfaces to the CHS over each chip site.

In the case of boiling, heat transfer can be enhanced by improving the boiling characteristics of the jet cooled surfaces. Various processes (metal sprayed powder, sintering, electroplating) can be used to deposit a porous layer of metal particles or fibers on the CHS over each chip-site. This type of boiling surface can yield substantial reductions in the surface-to-fluid temperature difference at a given heat flux.

In the preferred embodiment, the CHS is part of a multi-chip module and is sandwiched between the substrate (or a flange attached to the substrate) and a hat having slot jet orifices. Compliance of the CHS to chips of different height and to the curvature of individual chips is ensured by positioning small diameter springs or spring loaded plungers over each chip site. Flexibility of the sheet between chip sites ensures chip-to-chip compliance. The sheet thickness is selected to ensure compliance to chip curvature. A suitable thickness is readily achieved because the sheet need not serve as a barrier between the chips and the coolant.

If a plunger is used, fluid can be impinged on a chip site through a slot or circular nozzle in the plunger, through the gap between the plunger and its retaining hole, or through an array of circular jet orifices surrounding the plunger.

The above described module takes advantage of high impingement cooling rates, while achieving greater cooling, at similar flow rates, than direct jet impingement.

BRIEF DESCRIPTION OF THE DRAWINGS

The present invention will be better understood by reference to the attached drawings, in which.

Like reference numerals appearing in more than one FIGURE designate like elements.

DETAILED DESCRIPTION OF THE PREFERRED EMBODIMENTS

Figure 1:
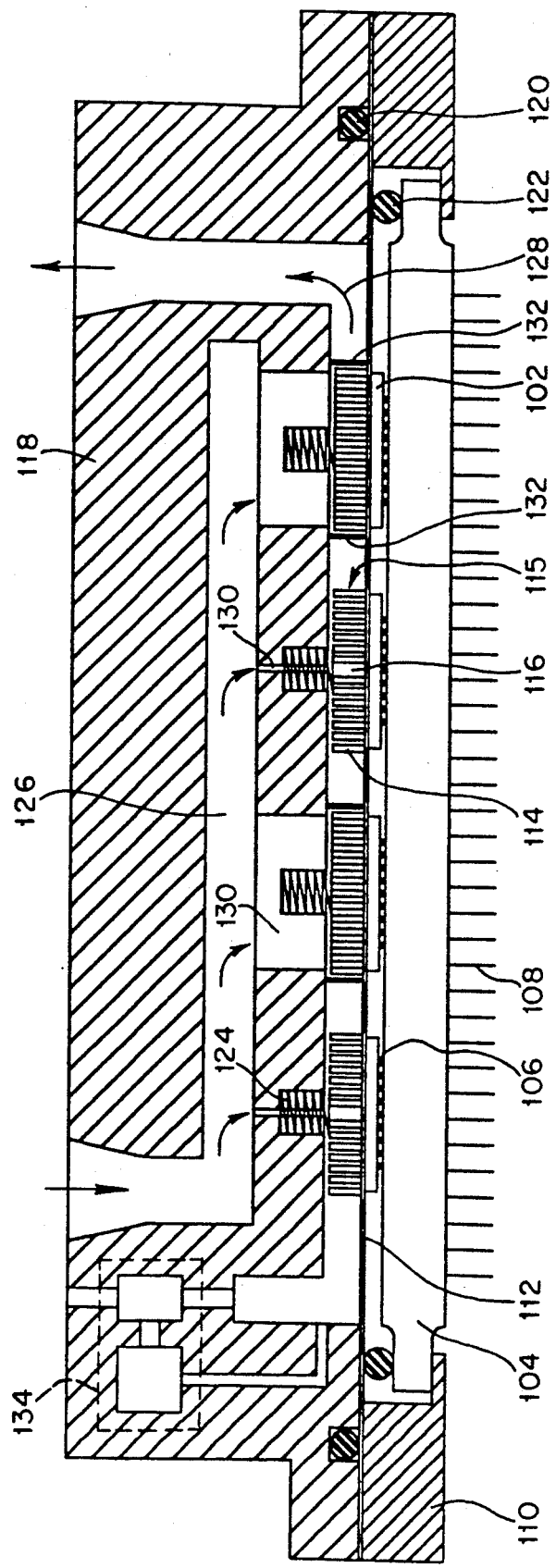
FIG. 1 is a side cutaway view of an electronic module according to an embodiment of the present invention.

An electronic module embodying the principles of the present invention will first be described by reference to FIGS. 1-4. As is conventional, the present multi-chip circuit module comprises microelectronic computer chips 102 arranged in a row and column array and attached to a metalized ceramic substrate 104 by means of metal contacts or solder balls 106 (also known as C4s). The substrate has pins 108 extending from the other side thereof. The pins 108 provide for the plugging of the apparatus into a board (not shown) which may carry connecting circuitry, etc. The substrate rests in a conventional base plate 110.

According to an embodiment of the present invention, a monolithic, thin metal sheet 112 (preferably in a thickness range between 5 and 15 mils) rests on the chip set and is perforated 202, 204 (FIG. 2) between the chip sites. A staggered array 115 of circular pin-fins 114 is centered over each chip on the module. Both the sheet and the pin fins are preferably made of a good heat conducting material such as copper. The pin-fin arrays are uniform, except for the absence of a single row 116 which bisects the array. The orientation of this missing row is staggered by 90 degrees between neighboring chip sites. A hat like structure (hat) 118 overlies the sheet and is connected to the base plate 110 by screws (not shown) such that the sheet 112 is securely sandwiched between the hat 118 and the base plate 110. Seals 120, 122 are provided between the hat 118 and the sheet 112 and between the base plate 110 and the sheet 112 so as to provide a liquid-tight enclosure.

Figure 3:
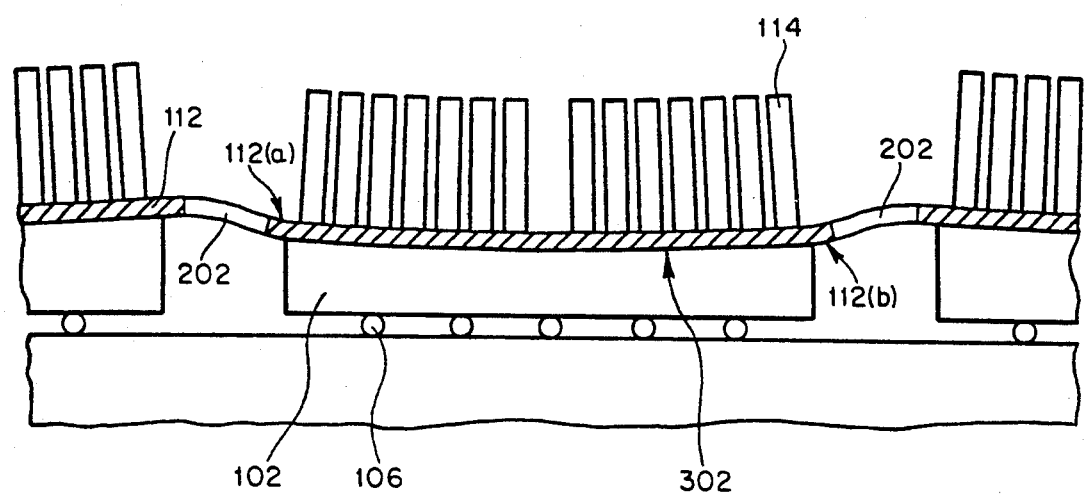
FIG. 3 is an enlarged partial side view of the compliant heat sink of FIG. 1, showing the pin-fins, an area of compliance and the chip to heat sink interface.
Figure 4:
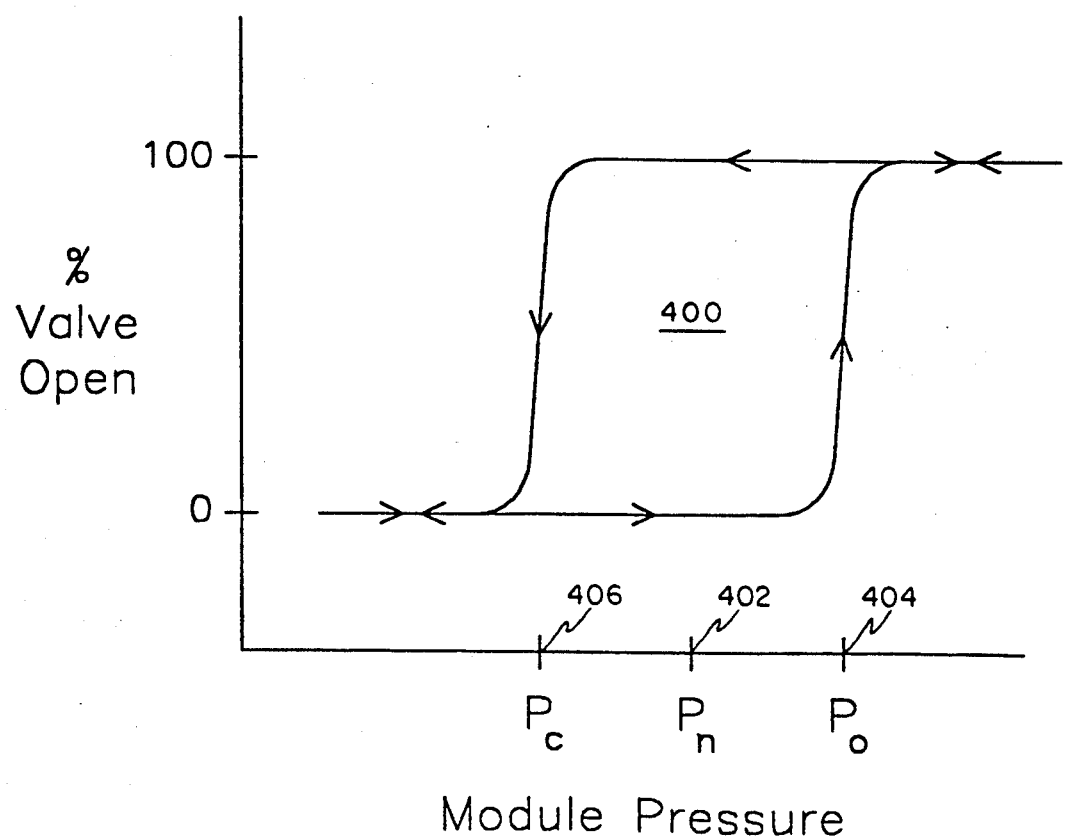
FIG. 4 is a graphic illustration of the operational characteristics of the pressure actuated vent (PAV) of the module of FIG. 1.

As best seen in FIG. 3, all of the pin-fins 114 protrude from one side 112(a) of the sheet 112, which faces away from the chips 102. The opposite face 112(b) of the sheet 112 is held in direct contact with the chips 102 by a spring 124 (FIG. 1) or spring loaded plunger located over each chip. The pin-fins 114 in the arrays are packed at a sufficiently high density such that the spring 124 will rest on the tops of the pin-fins. The magnitude and area of the load provided by the spring or spring loaded plunger is such that compliance of the sheet to chip curvature is enhanced. Surfaces of the sheet that contact the chip are prepared in accordance with conventional piston cooling technology to achieve good thermal contact with the chip.

Figure 2:
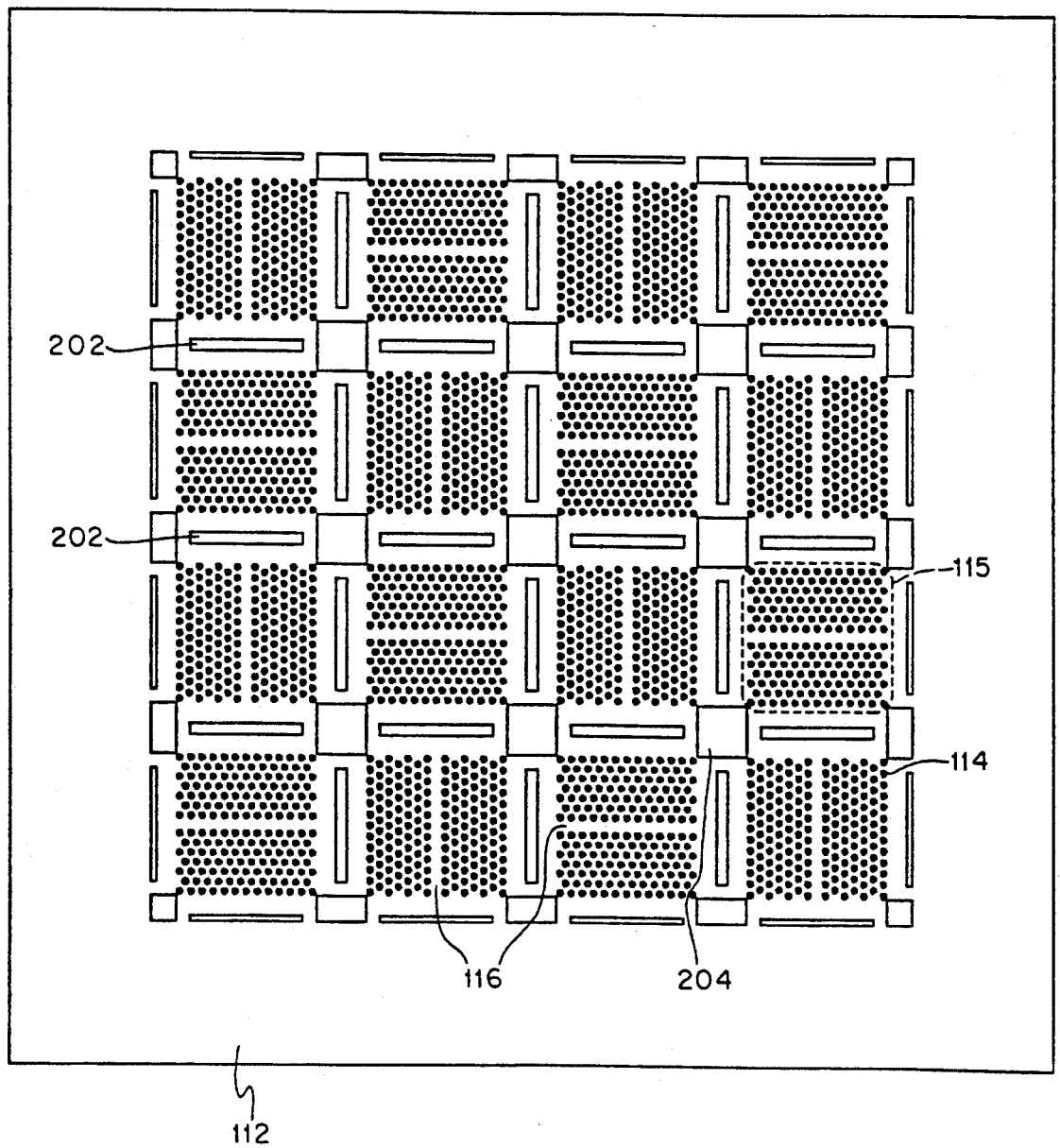
FIG. 2 is a top view of the compliant heat sink of the module of FIG. 1.

As best seen in FIGS. 2 and 3, the perforations (slots 202 and holes 204) perform several functions. They weaken the mechanical link between regions of continuous sheet that are centered over the chips and thereby permit compliance of the sheet between neighboring chips of differing height. The perforations also enable the coolant (fluorocarbon, liquid nitrogen or other dielectric fluid) to flow freely through the sheet, so that the module, chips and chip-to-sheet interface are fully immersed in the liquid. Free flow through the perforations ensures continuous pressure equalization across the sheet, which minimizes fatigue of the solder balls and ensures good chip-to-sheet interface performance in the event of module pressure fluctuations. The square holes 204 placed on the chip site corners (or on the corners of 4-chip groups) also allows for clearance of electronic components or other structures that protrude above the surface of the sheet.

Turning again to FIG. 1, supply 126 and discharge 128 manifolds are formed in the hat-like structure 118. As is conventional, the supply and discharge manifolds are coupled to a coolant distribution unit (not shown) which provides a circulating flow of a liquid dielectric coolant under pressure. The coolant (represented by arrows) is delivered from the supply manifold to each chip site through a planar nozzle 130. The nozzle is parallel to and directly over the absent row of pins 116. The coolant impinges on the sheet 112 and then flows over the pins 114. The gap between the tip of the pins and the hat is sufficient to permit some flow across the pin tips, while forcing the bulk of the flow to pass through the pin array.

Baffles 132, which are parallel to each other and normal to the orientation of the missing row of pins 116, extend down from the hat 118 and limit the discharge of coolant from the two sides of the pin array that are parallel to the primary direction of fluid flow through the pins. The baffles 132 can be made from the same material as the hat (e.g. copper or plastic), or can be made of an elastomer and be bonded to the CHS.

Heat generated by the chips 102 is conducted across the chip-to-sheet interface and into the sheet 112. Some cooling will occur by convection from the sheet directly to the impinging planar jet, while additional cooling occurs by conduction into the pin-fins and convection to the fluid flowing across the pins. After flowing over the sheet and the pins, the coolant is discharged through the discharge manifold 128. The hat does not participate in the dissipation of heat and therefore need not be a thermal conductor (e.g. The hat could me made of plastic).

The module of FIG. 1 is also provided with a pressure activated vent (PAV) 134. In addition to acting as a simple pressure relief valve, the PAV 134 serves to protect the chip set from overheating (e.g. in the event of a loss of coolant). A graphic illustration of the operational characteristic 400 of the PAV 134 is provided in FIG. 4. The highest power chips operate near the saturation temperature of the coolant for normal operating pressure ($P_n$) 402 in the module. If the temperature of one or more chips rises unacceptably, the coolant will boil from the superheated surfaces and the resultant vapor will cause an increase in pressure in the module. The PAV opens and vents to atmosphere when the module pressure rises to a predetermined upper limit ($P_o$) 404, but does not close until the pressure falls to a predetermined level ($P_c$) 406 which is below the normal operating pressure ($P_n$). The saturation temperature of the coolant will decrease as the pressure decreases, resulting in more vigorous nucleate boiling to augment convective cooling from overheated chip, sheet and fin surfaces. The PAV, therefore, will permit a controlled shut down of the module without damage to the chips or loss of data.

Figure 5:
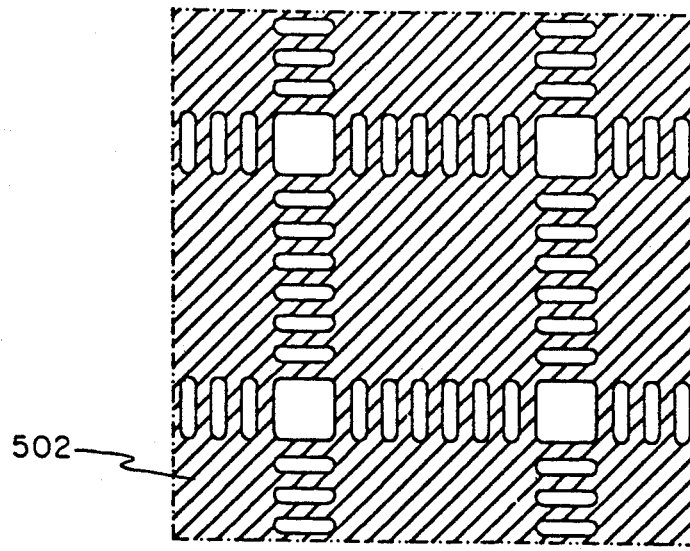
FIG. 5 is an illustration of a perforation pattern according to a first alternative embodiment of the compliant heat sink of FIG. 2.
Figure 6:
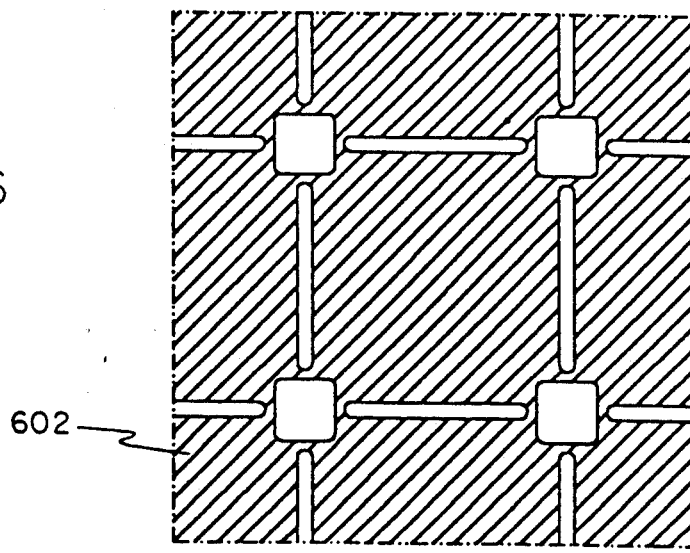
FIG. 6 is an illustration of a perforation pattern according to a second alternative embodiment of the compliant heat sink of FIG. 2.
Figure 7:
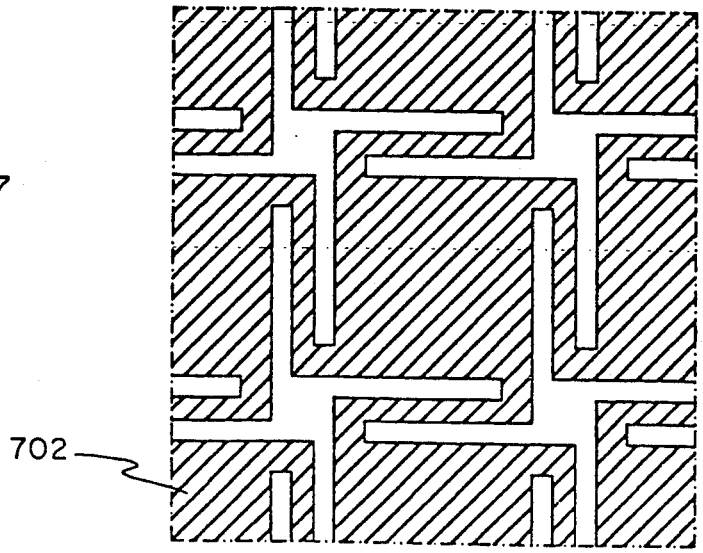
FIG. 7 is an illustration of a perforation pattern according to a third alternative embodiment of the compliant heat sink of FIG. 2.

The perforated sheet 112 and pin-fins 114 or other extended surfaces comprise a one piece heat sink which serves the entire module and readily complies to both chip curvature and chip-to-chip height variations. The following are variations and additional features of this Compliant Heat Sink (CHS):

A variety of perforation patterns can be used as shown, for example, in FIGS. 5-7. These embodiments do not have fins (although fin arrays may be added) and can be formed in a single stamping, etching or laser machining operation. The unfinned CHS patterns 502, 602, 702 serve to enhance cooling by spreading heat dissipated by the chip to a larger area that is cooled by an impinging jet(s). In any event, the specifications of CHS perforations and thickness must achieve the required compliance while maintaining sufficient structural integrity. The various perforation patterns (FIGS. 5-7) provide greater latitude in selecting the sheet thickness, which affects compliance to both chip height and curvature. Embodiments 502-702 are in order of decreasing stiffness (increasing capacity for chip-to-chip compliance) and decreasing structural integrity.

Figure 8:
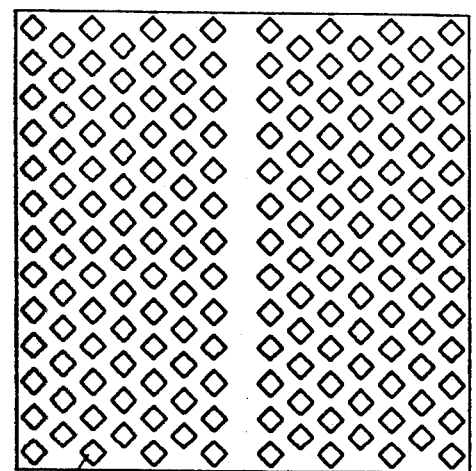
FIG. 8 is an illustration of a first alternative fin array arrangement wherein the compliant heat sink of FIG. 2 includes staggered arrays of square pin-fins.
Figure 9:
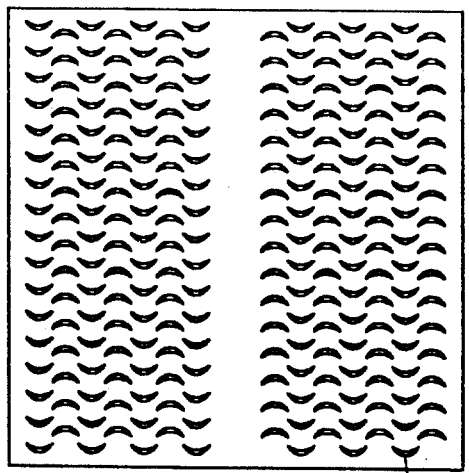
FIG. 9 is an illustration of a second alternative fin array arrangement wherein the compliant heat sink of FIG. 2 includes fin arrays made up of a plurality of curved vanes formed on the heat sink surface and arranged in an alternating pattern.
Figure 10:
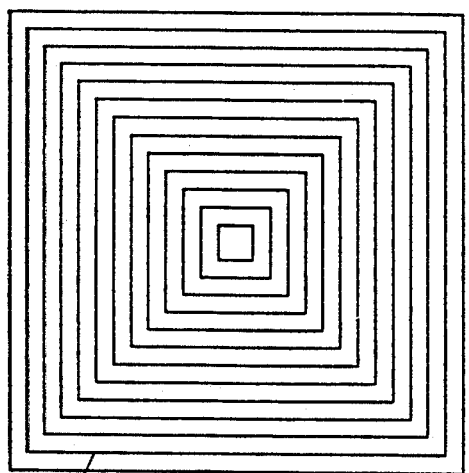
FIG. 10 is an illustration of a third alternative fin array arrangement wherein the compliant heat sink of FIG. 2 includes fin arrays made up of a plurality of narrow grooves formed on the heat sink surface and arranged in a pattern of embedded squares.
Figure 11:
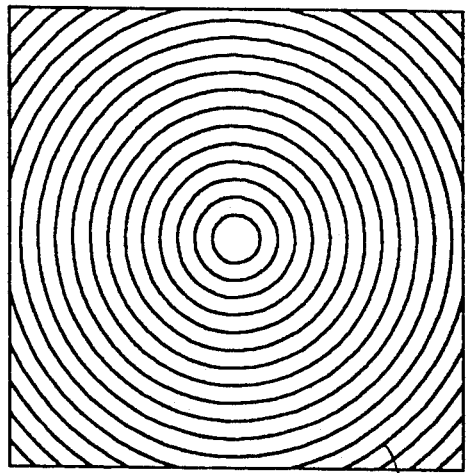
FIG. 11 is an illustration of a fourth alternative fin array arrangement wherein the compliant heat sink of FIG. 2 includes fin arrays made up of a plurality of narrow grooves formed on the heat sink surface and arranged in a pattern of concentric circles.
Figure 12:
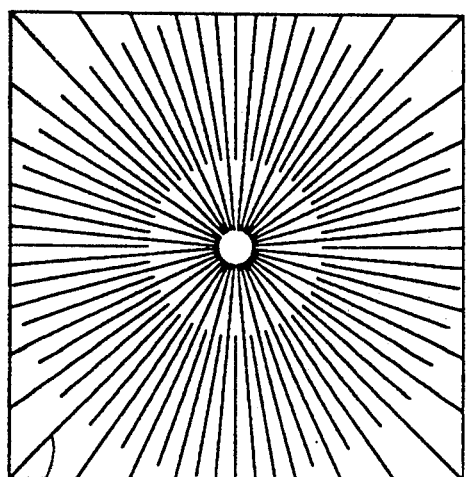
FIG. 12 is an illustration of a fifth alternative fin array arrangement wherein the compliant heat sink of FIG. 2 includes fin arrays made up of a plurality of narrow grooves formed on the heat sink surface and arranged in a radial pattern.
Figure 13:
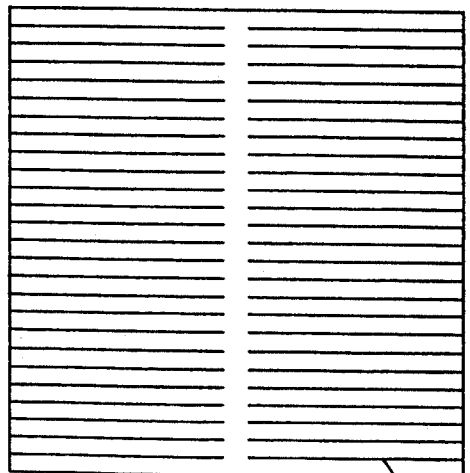
FIG. 13 is an illustration of a sixth alternative fin array arrangement wherein the compliant heat sink of FIG. 2 includes fin arrays made up of a plurality of narrow grooves formed on the heat sink surface and arranged in a straight pattern.

Low aspect ratio (AR) structures (AR of order unity or less) can be formed by conventional etching and deposition processes. Taller structures (AR greater than unity) are readily formed by conventional machining (e.g. milling, saw cutting), electro-discharge machining (EDM) and electro-forming processes. The following are examples of suitable extended surface structures: (1) constant pitch, regular array of circular pin-fins, (2) constant pitch, staggered array 115 of circular pin-fins 114 (3) constant pitch, regular array of square pin-fins, (4) constant pitch, staggered array of square pin-fins 802 (FIG. 8), (5) arrays having variable fin pitch, (6) arrays of curved vanes (902 of FIG. 9 for example), (7) narrow grooves 1002, 1102, 1202, 1302 in the sheet surface, which may be square (FIG. 10), circular (FIG. 11), radial (FIG. 12), or straight (FIG. 13), and may be implemented in various combinations to yield cross-hatching.

The performance of staggered pin-fin arrays is superior to that of a regular array, but the manufacturing costs can also be higher. Square pin-fins are superior to but generally more expensive than round ones. A regular array of square fins can, however, be readily manufactured by saw cutting. The performance of both regular and staggered arrays with round jets is diminished by line-of-sight paths for the coolant to exit from the array without flowing over the fins. A staggered array is well suited to use with a planar jet, since baffles 132 can be used to channel the coolant over the fins with no line-of-sight losses. An array of round jets would, however, be preferred when the CHS is without fins, or when the fin pitch is large, since the direct impingement component of the overall cooling performance is greater for arrays of round jets than for one or more planar jets. Greater total cooling (combined contributions from direct impingement and the fins) is achieved, however, with a dense (small fin pitch), staggered fin array and a slot jet. Total performance can also be enhanced by customizing the fin shape to increase the convection cooling contribution by each fin. This is achieved, for example, by the vane-fins 902, which are designed to increase the flow path length across the CHS (e.g. by swirling or inducing a serpentine motion) and/or to cause the fluid flowing from the tip of one vane to impinge on a neighboring vane. Variable pitch fin arrays can be used to block radial (circular jet) line-of-sight flow paths, and to achieve uniform chip temperature through coolant velocity control and varying extended surface area, thereby compensating for the effects of coolant temperature rise and/or local chip heat flux variations. High aspect ratio (AR) fins will outperform low AR fins, but at greater manufacturing cost. In the specific case of a low aspect ratio, when fins are formed by etching or deposition methods, there will be little cost advantage of one fin geometry over another. The primary motivation for selecting one pin type over another is then reduced chip-to-chip temperature variations and chip cooling customization.

Grooves are low aspect ratio structures by definition and, in addition to etching and deposition methods, may be formed by scoring. Flow normal or parallel to the groove orientation can yield superior performance for different groove dimensions, coolants and/or flow conditions. The square 1002 and circular 1102 grooves result in a flow that is mostly normal to the groove orientation for a centered, round jet. The radial grooves 1202 result in a flow that is parallel to the groove orientation for a centered round jet. A planar jet can be turned for flow along the sheet that is normal or parallel to the straight 1302 grooves. Under certain flow conditions, cross hatching may further enhance cooling performance.

In the event of nucleate boiling, heat transfer can be enhanced by known methods involving the deposition of particles or fibers on the jet cooled surfaces over each chip site.

Site-by-site definition of extended surface arrays permits cooling customization to achieve greater uniformity of circuit operating temperatures.

The following are variations and additional features to enhance thermal performance of the chip-to-sheet interface 302: (1) application of a conventional thermally conductive wax, (2) application of a known dielectric, metal-filled paste, (3) fine grooves in the CHS where the sheet contacts the chip site (to promote spreading and uniform coverage of any thermally conductive wax or paste), (4) alternatively, the grooves could be filled with a thin coat of reflowable interface material, such as an Indium solder, applied to the back of the CHS prior to module assembly, (5) even in embodiments without the grooves, the face of the sheet that lies against the chip set can be clad with a soft metal, such as Indium (to enhance compliance to surface roughness and flaws at the chip-to-sheet interface).

Variations to the module itself can also be made. For example, alternative impingement flow arrangements include the use of single round nozzles and arrays of planar or round nozzles. (Advantages of each flow arrangement have been described in conjunction with the discussion of advantages of the various fin and groove structures.) Further, a temperature activated vent (TAV) could be used instead of or in addition to the pressure actuated vent. The TAV performs the same function as the PAV but is activated by temperature instead of pressure. Sensors imbedded in the hat measure the temperature of the effluent from individual chip sites. If the chip temperature rises unacceptably, the effluent temperature will also increase, causing a temperature sensor to activate the vent. The vent would close only when the effluent temperature falls to an acceptable level, or the operator shuts down the module.

Direct attachment of a heat sink to a chip enhances cooling by reducing the thermal contact resistance between the chip and the heat sink. A high performance chip-to-sheet interface can be achieved by directly bonding the CHS to the chip set with solder or other thermally conductive material. In such an embodiment, the exertion of a loading force to press CHS against each chip is not required, except during the joining operation. Thermal stress caused by differences in the coefficients of thermal expansion (CTE) of the CHS, interface and chip materials could, however, cause failure of the chip-to-heat sink bond, which would severely compromise thermal performance. The thermal stress related load imposed on other module components may also be unacceptable.

Figure 14:
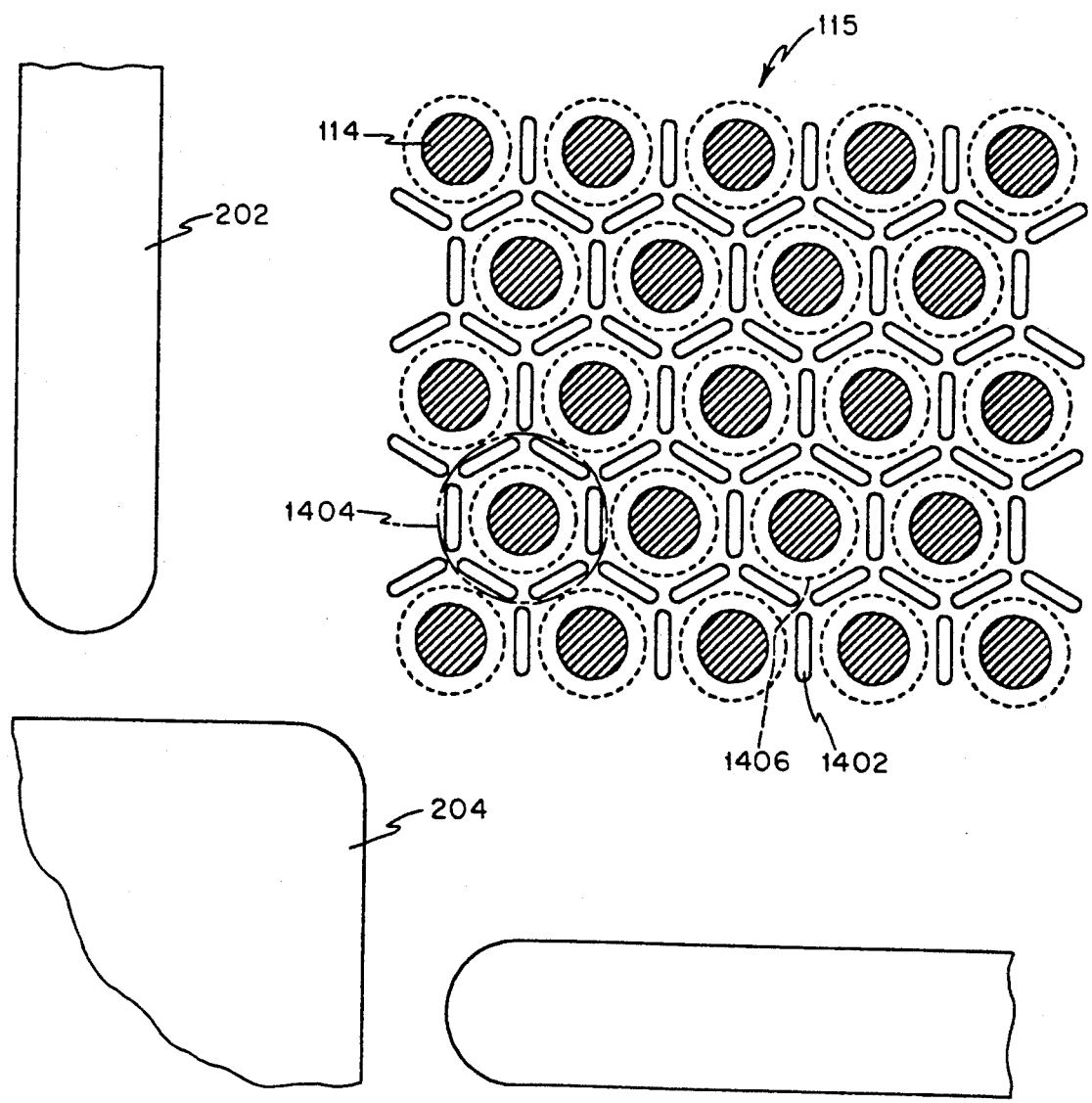
FIG. 14 is an enlarged illustration of an array of circular pin-fins having micro-perforations surrounding each pin-fin.

In order to avoid the problems caused by CTE differentials, micro-perforations are provided in the CHS sheet. As illustrated in FIG. 14, these perforations are comprised of narrow (0.001–0.010") slits 1402, which divide each chip site into hexagonal cells 1404 (for staggered extended surface arrays), or square cells (for regular extended surface arrays). Extended surfaces (such as the circular pin fins 114) can be placed at the center of each cell. Solder is applied to a region 1406 of each cell on the side of the sheet which faces the chip(s).

Each of these solder regions corresponds to a discrete metalized pad on the back of the chip. These pads are metal depositions to which solder will adhere and are discrete (like the C4 pads) to limit thermal stress due to CTE differences between the metallization and the chip material. If necessary, the pads can also be "tinned" with solder prior to joining to the pin fins.

Hooks law and the thermal expansion mismatch between the chip, solder bond and CHS fixes the relative displacement, or strain, of material elements throughout the system, and the associated stress. Although the CTE related stress across an individual cell is small because the bond area is small, forces associated with this stress will be transmitted to neighboring cells, and the total forces exerted by CTE effects will be the summation of contributions by each cell. However, the individual cells are connected to each other only by narrow webs of material, where the tips of the slits from neighboring cells meet. These webs are not attached to the chip, and the cross sectional area of the webs is small, so that the required cell-to-cell displacement, and resulting stress levels, are achieved with limited force exerted between cells. The stress required by CTE mismatch is effectively concentrated in the webs, which greatly reduces the forces exerted on the rest of the module.

Figure 15:
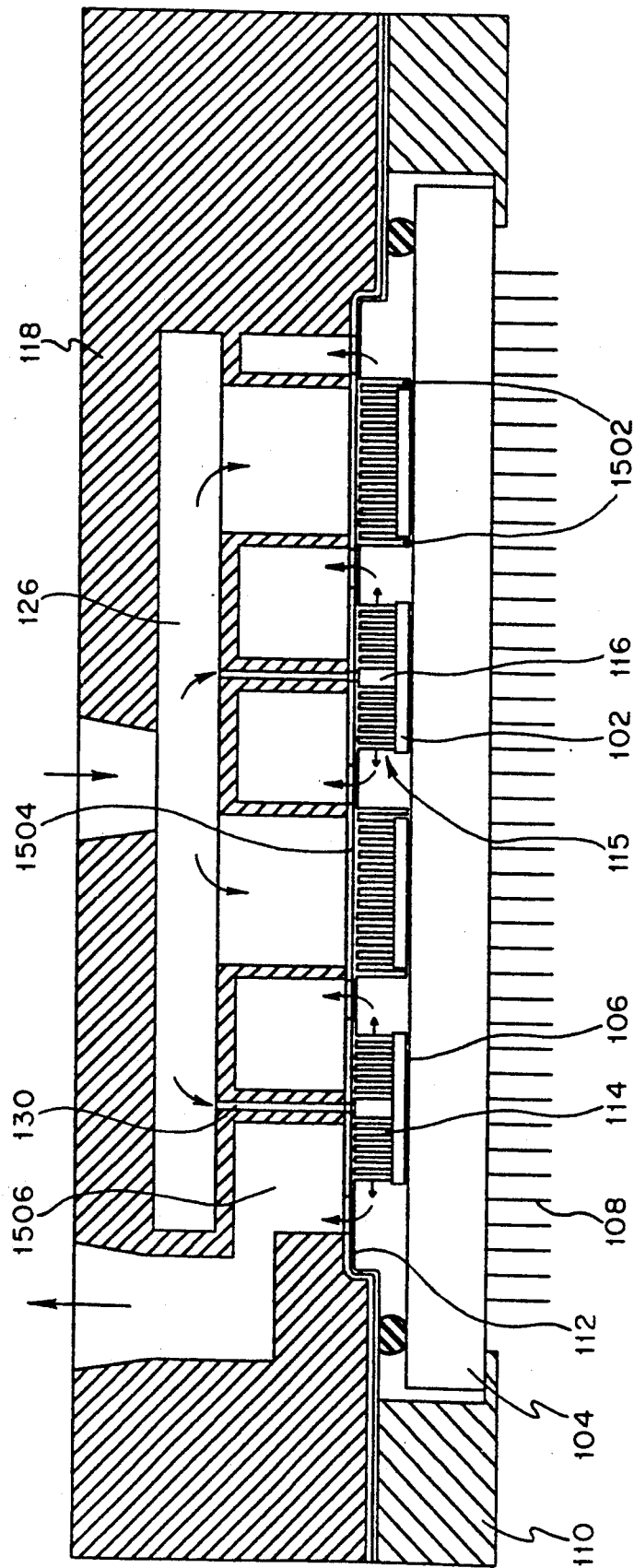
FIG. 15 is a side cutaway view of an alternative embodiment of an electronic module embodying the principles of the present invention.
Figure 16:
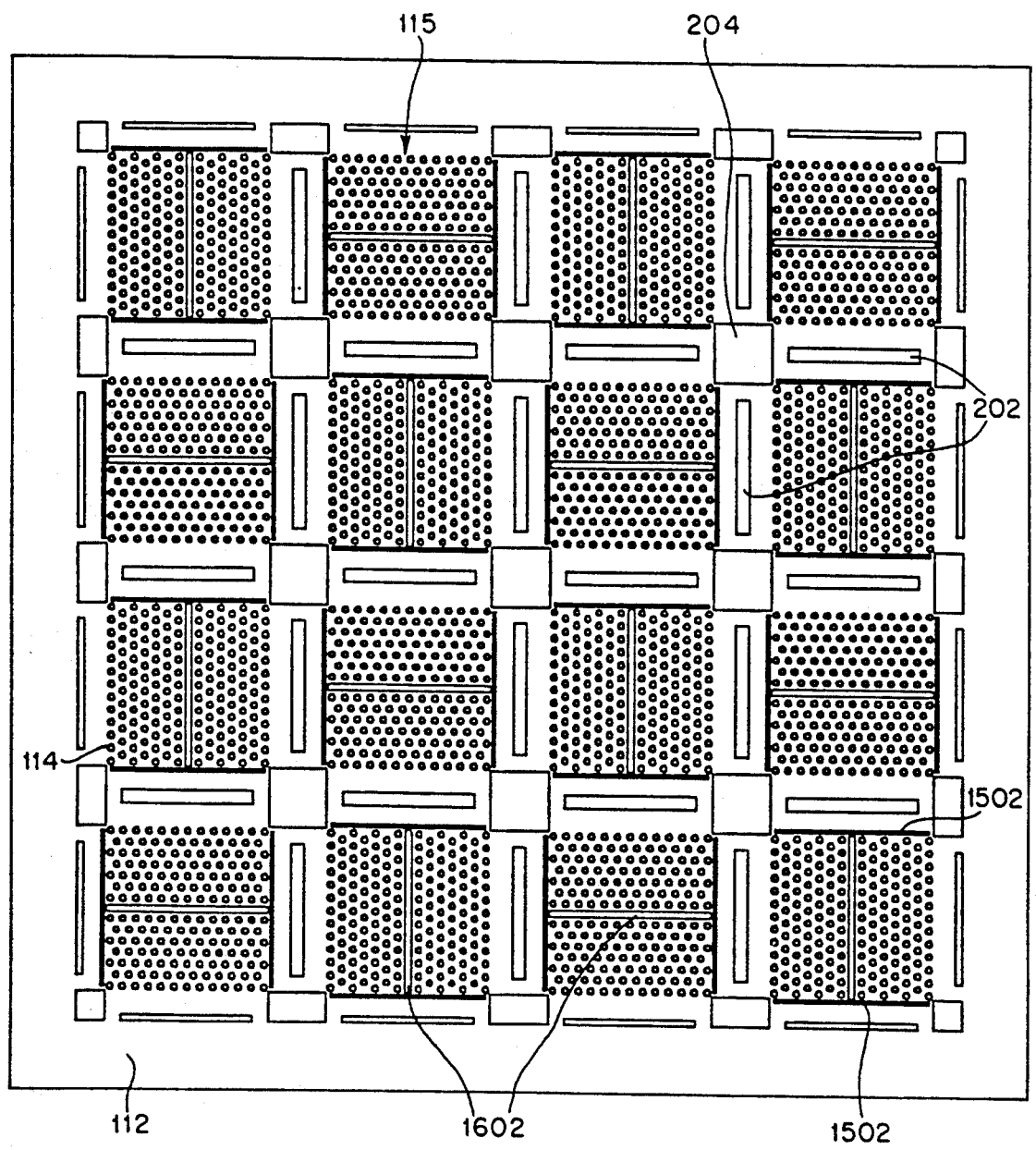
FIG. 16 is a bottom view (pin side) of the compliant heat sink of the module of FIG. 15.
Figure 17:
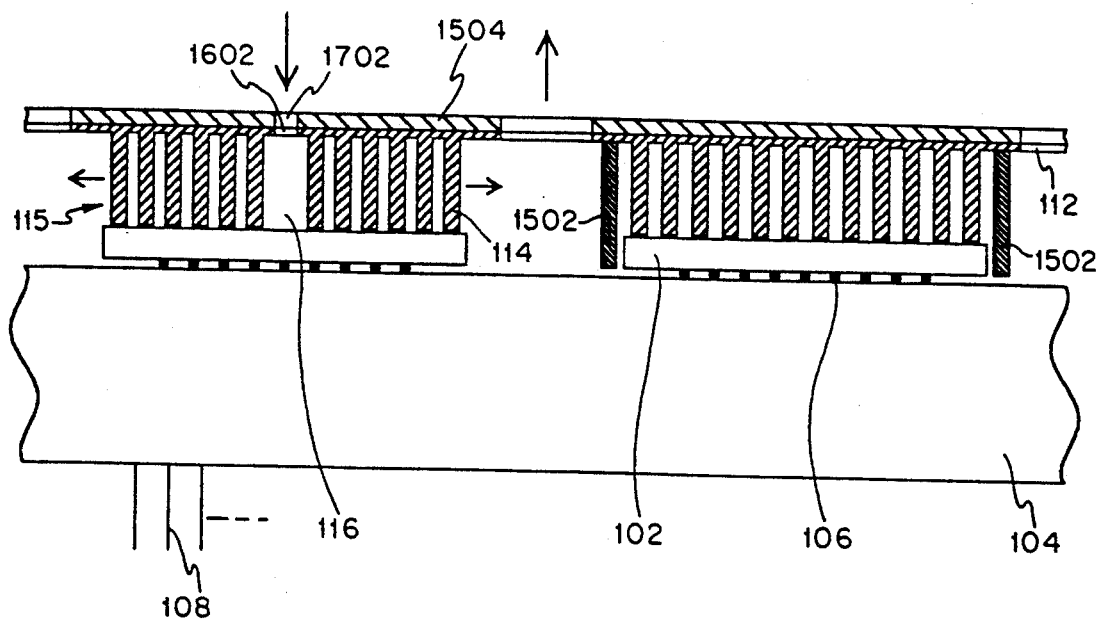
FIG. 17 is an enlarged partial side view of the compliant heat sink of FIG. 15, showing the pin-fins and the chip to heat sink interface.

FIGS. 15 through 17 illustrate an alternative embodiment of an electronic module having a modified version of the Compliant Heat Sink (CHS), which serves as a one piece carrier for pin fin arrays. Modifications to the CHS are as follows: (1) a rectangular nozzle (slot) 1602 is centered over each pin fin array, dividing the array into subgroups of equal size, (2) flow baffles 1502 are attached the sheet so that two opposite sides of each pin fin array are covered; (3) the tips of the pin fins have been "tinned" with a solder. As with the module of FIG. 1 and the compliant heat sink of FIG. 2, Orientation of the nozzles and baffles is staggered from one pin fin array to the next. The baffles 1502 may be one piece and plate-like or, if this impedes compliance to the chip near the baffle, they may be comprised of a close set plates or pins. The baffles 1502 can be made of the same material as the compliant heat sink (e.g. copper), or, they can be made from an elastomer and tacked to the CHS.

As best illustrated in FIG. 17, the free tips of the pin-fins 114 are placed in direct contact with the discrete solder pads on the back of the chip 102. Like those of the embodiment of FIG. 14, these pads are metal depositions to which solder will adhere and are discrete (like the C4 pads) to limit thermal stress due to CTE differences between the metallization and the chip material. If necessary, the pads can also be "tinned" with solder prior to joining to the pin fins. A load is applied to the back of the CHS sheet in a fixture. The load is distributed to ensure contact between each pin and a solder pad prior to the heating/joining operation. Once the pin fins are joined to the chip array the module is removed from the joining fixture and is ready for final assembly. Thermal expansion mismatch between the chip and heat sink materials is readily accommodated since (1) the bond area for each pin is small so that expansion mismatch at an individual bond site will be small and (2) length/diameter of the pins is chosen such that they readily deflect to accommodate thermal expansion effects associated with cooling following pin-to-chip joining, and temperature cycling through out the life of the module. Thermal stresses will be greatest when the module is inoperative (i.e. at room temperature).

An elastomer sheet 1504 is either bonded to or held by fluid pressure against the back of the CHS sheet. The elastomer acts as a gasket between the CHS and hat, and forms a seal around the module perimeter and against the tip of each nozzle.

Turning again to FIG. 15, the coolant (represented by arrows) is supplied to the module through a plenum 126, flows to the pin fin arrays through the rectangular nozzles 130 and matching slots in the elastomer sheet 1702 and CHS 1602, and exits through the CHS compliance perforations 202,204 to discharge flow passages 1506 in the hat. Heat is removed from each chip by direct liquid jet impingement, and by conduction into the pin fins or other extended surfaces, followed by convection to a coolant in cross flow with the pins.

The cost to manufacture extended surfaces or enhanced boiling surfaces is minimized by forming them simultaneously on a single complaint sheet for an entire module. An unenhanced CHS (e.g. FIG's. 1 and 2) can be mass produced by photo-chemical machining, laser machining, or die punching. The enhancements (e.g. FIG's 8-13) are then added by an additional step that involves etching, deposition, electro-forming or machining. This manufacturing procedure also lends itself to simple and inexpensive cooling customization since the enhancements added to each chip-site by etching or deposition processes are easily varied. An alteration to photo-chemically etched structures at an individual site, for example, would involve only the cost of a new photo-tool.

The cost of the hat and plungers will be much less than today's conduction cooling hardware. Since they do not participate in the heat dissipation process, manufacturing tolerances can be relatively lose and non-conductive materials, such as injection molded plastics, can be used.

It should be understood that the above-described embodiments are presented as examples and not as limitations. Modifications may now occur to those skilled in the art. Accordingly, the invention is not to be regarded as being limited by the embodiments disclosed herein, but is defined by the appended claims.

Having thus described our invention, what we claim as new and desire to secure by Letters Patent is:

1. An apparatus for cooling an array of integrated circuit chips mounted on a substrate, comprising:
    a) a housing overlying said substrate, said housing having a coolant supply manifold for supplying a liquid dielectric coolant, and a coolant discharge manifold formed therein and having a plurality of nozzles connecting said coolant supply manifold to said coolant discharge manifold, said nozzles being disposed within said housing such that at least one of said nozzles overlies each of said integrated circuit chips;
    b) a unitary sheet of thin-wall pliable heat conductive material overlying said substrate, said sheet being in contiguous engagement with each of said integrated circuit chips and having a plurality of through holes formed therein such that coolant from said discharge manifold is brought into direct contact with said chips; and
    c) biasing means, mounted in said housing above said sheet, for applying individual biasing forces on said sheet at each location thereof which is in continuous engagement with said integrated circuit chips;

wherein said integrated circuit chips are cooled by a combination of direct liquid immersion, liquid jet impingement and thermal conduction and wherein coolant pressure on both sides of said sheet is equalized.

2. The apparatus of claim 1 wherein said sheet comprises particles and/or fibers formed thereon and disposed on said sheet overlying each location thereof which is in contiguous engagement with said integrated circuit chips.

3. The apparatus of claim 1 wherein said nozzles are of a planar shape and wherein each one of said nozzles is disposed so as to be rotated at ninety degrees with respect to its perpendicular neighbors.

4. The apparatus of claim 1 wherein said housing has a pressure relief opening formed therein and further comprising a pressure actuated vent connected in between said coolant discharge manifold and said pressure relief opening.

5. The apparatus of claim 1 wherein said sheet comprises arrays of fins thereon and disposed on said sheet overlaying each location thereof which is in contiguous engagement with said integrated circuit chips.

6. The apparatus of claim 5, further comprising a plurality of baffles extending from said housing and disposed on two opposite sides of each of said arrays.

7. The apparatus of claim 5 wherein said arrays of fins comprise staggered arrays of pins each having a circular cross section.

8. The apparatus of claim 5 wherein said arrays of fins comprises a plurality of concentrically arranged circular grooves formed in said sheet.

9. The apparatus of claim 5 wherein said arrays of fins comprise a plurality of concentrically arranged square grooves formed in said sheet.

10. The apparatus of claim 5 wherein said arrays of fins comprise a plurality radially arranged grooves formed in said sheet.

11. The apparatus of claim 5 wherein said arrays of fins comprise a plurality of curved vanes arranged an alternating pattern so as to cause fluid flowing from one of said vanes to impinge on a neighboring other one of said vanes.

12. The apparatus of claim 5 wherein said arrays of fins comprise staggered arrays of pins each having a square cross section.

13. The apparatus of claim 5 wherein at least some of said holes are disposed annularly around each of said fins.

14. The apparatus of claim 5 wherein each of said arrays of fins include a rectangular shaped area void of said pins and bisecting said arrays, wherein said nozzles are of a planar shape and wherein each one of said nozzles is disposed so as align with said area.

15. The apparatus of claim 14 wherein said area within each array is rotated at ninety degrees with respect to a like area within a perpendicularly disposed array.

16. An apparatus for cooling an array of integrated circuit chips mounted on a substrate, comprising:
a) a housing overlying said substrate, said housing having a coolant supply manifold and a coolant discharge manifold formed therein said supply manifold having a plurality of nozzles extending therefrom;
b) a sheet of thin-wall pliable heat conductive material overlying said substrate, said sheet being in contiguous engagement with each of said integrated circuit chips;
c) said sheet comprising arrays of pin-fins formed thereon and disposed on said sheet overlying each location thereof which is in contiguous engagement with said integrated circuit chips, said pin-fins being connected to both said sheet and said integrated circuit chips; and
d) an elastomer membrane covering said sheet on a side opposite said integrated circuit chips, said membrane and said sheet having at least one hole formed therethrough over each of said arrays and disposed to receive coolant from at least one of said nozzles, said membrane and said sheet further having discharge holes formed therethrough and disposed between said arrays so as to deliver said coolant to said discharge manifold.

17. The apparatus of claim 16 wherein said nozzles are of a planar shape and wherein each one of said nozzles is disposed so as to be rotated at ninety degrees with respect to its perpendicular neighbors.

18. The apparatus of claim 16, wherein said housing comprises a pressure relief opening formed therein and further comprising a pressure actuated vent connected in between said coolant discharge manifold and said pressure relief opening.

19. The apparatus of claim 16 wherein said pressure actuated vent operates according to a hysteresis function.

20. The apparatus of claim 16 wherein said sheet further comprises a plurality of pairs baffles extending therefrom and disposed on opposite sides of each of said arrays.

21. The apparatus of claim 16 wherein one of said pairs of baffles is rotated by 90 degrees with respect to a contiguously neighboring pair of baffles.

22. The apparatus of claim 16 wherein said arrays are of of variable pitch.

* * * * *